United States Patent [19]
Hower et al.

[11] 4,231,059
[45] Oct. 28, 1980

[54] TECHNIQUE FOR CONTROLLING EMITTER BALLAST RESISTANCE

[75] Inventors: Philip L. Hower, Pittsburgh; Derrick J. Page, Murrysville Borough, both of Pa.

[73] Assignee: Westinghouse Electric Corp., Pittsburgh, Pa.

[21] Appl. No.: 956,813

[22] Filed: Nov. 1, 1978

[51] Int. Cl.² ............................................ H01L 23/48
[52] U.S. Cl. ...................................... 357/68; 357/65; 357/36; 357/38; 29/589; 29/591
[58] Field of Search ...................... 357/38, 65, 68, 36; 29/989, 591

[56] References Cited
U.S. PATENT DOCUMENTS

| | | | |
|---|---|---|---|
| 3,878,550 | 4/1975 | Benjamin | 357/36 |
| 3,895,977 | 7/1975 | Sanders | 148/187 |
| 3,975,754 | 8/1976 | Lehman | 357/38 |
| 4,008,484 | 2/1977 | Maekawa | 357/36 |
| 4,060,825 | 11/1977 | Schlegel | 357/38 |
| 4,127,863 | 2/1978 | Kurata | 357/38 |

*Primary Examiner*—Martin H. Edlow
*Attorney, Agent, or Firm*—J. B. Hinson

[57] ABSTRACT

A transistor in which this effective emitter resistance which is determined by the geometry of the emitter metallization as disclosed. In the preferred embodiment, the emitter metallization comprises a series of circular "dots" which are distributed over the entire emitter area. The area of the "dots" with respect to the entire emitter area is selected such that the desired effective emitter resistance is achieved.

16 Claims, 9 Drawing Figures

4,231,059

TECHNIQUE FOR CONTROLLING EMITTER BALLAST RESISTANCE

BACKGROUND OF THE INVENTION

1. Field of the Invention

The invention relates to semiconductor devices, and more specifically, to transistors having the emitter region partially metallized such that the transistor has a preselected effective emitter resistance and safe operating area.

2. Description of the Prior Art

The emitter metallization of prior art transistors was substantially coextensive with the area of the emitter region. The effective emitter resistance of the prior art transistors was primarily determined by the area of the emitter region and the contact resistance between the emitter region and the emitter metallization. Partial emitter metallizations also were used in prior art transistors to improve frequency response. However, in all of these prior art transistors, the area of the emitter metallization and the effective emitter resistance was not selected to prevent emitter current "collapse" and the resulting "hot areas".

SUMMARY OF THE INVENTION

The invention comprises a transistor which utilizes a body of semiconductor material having first and second substantially flat opposed major surfaces and an edge portion extending therebetween. The body of semiconductor material includes an emitter region, a base region and a collector region with the emitter and base regions extending to the first major surface and the collector region extending to the second major surface. An emitter metallization comprising a plurality of non-abutting metallized regions forms an electrical contact between the emitter region and an emitter electrode with the total area of the emitter metallization being substantially less than the area of the emitter region with the total area of the emitter metallization selected such that the transistor has a preselected safe operating area, with each of the metallized areas being less than the "hot areas" developed during thermally unstable operating conditions. Electrical contact is provided to the base and collector regions of the transistor by base and collector electrodes, respectively affixed to the base and collector regions.

DETAILED DESCRIPTION

Figure 1:
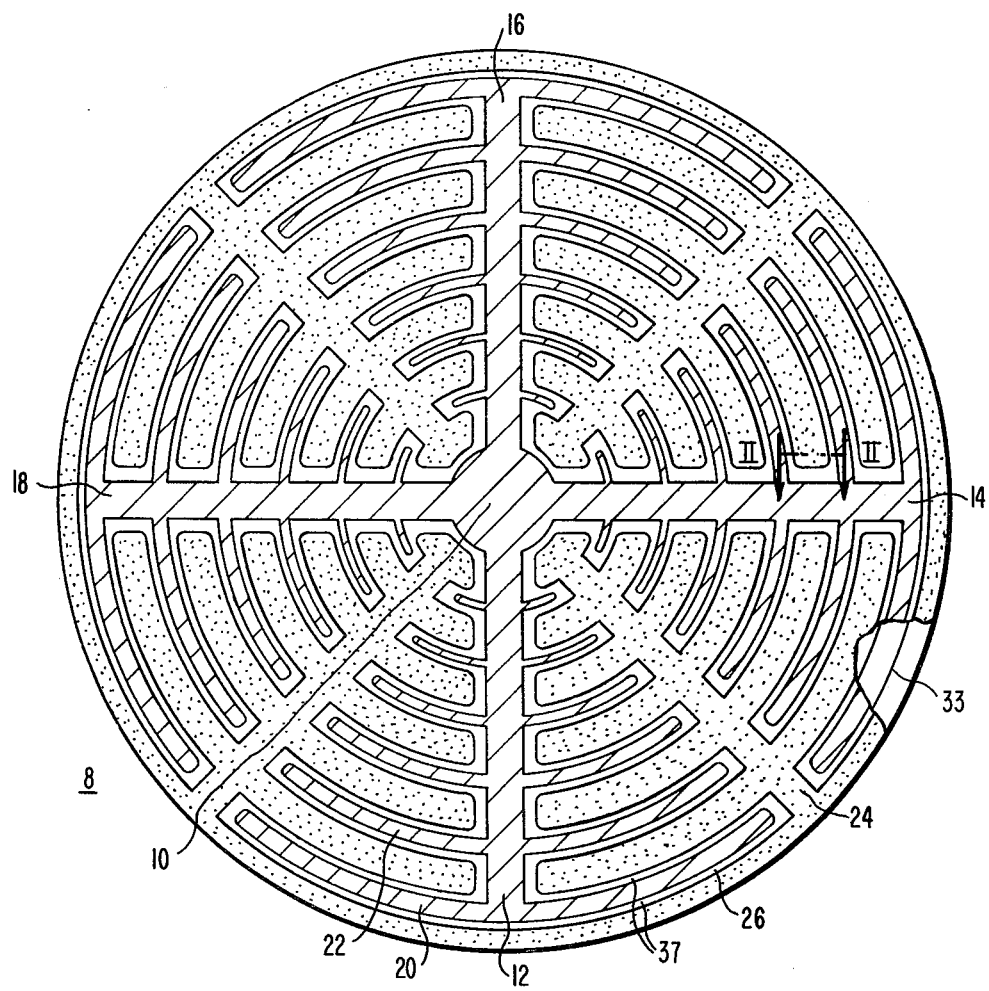
FIG. 1 is a top view of a typical prior art transistor.
Figure 2:
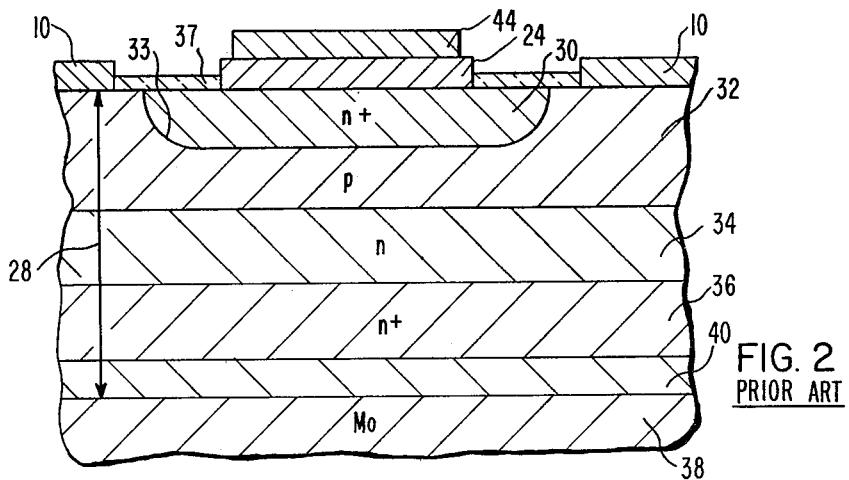
FIG. 2 is a partial cross-sectional view of the transistor illustrated in FIG. 1.

FIG. 1 is a top view and FIG. 2 is a partial cross-sectional view of a typical prior art high-power transistor 8. The transistor 8 includes a base metallization 10 comprising four outwardly extended arm portions 12, 14, 16 and 18, each having a plurality of circular members extended therefrom. Two typical circular members are identified by reference numerals 20 and 22. The transistor 8 also includes an emitter metallization 24 which is interdigitated with the base metallization 10. A PN junction 33 (FIG. 2) formed at the interface of the emitter and base regions, 32 and 30, extends to the upper surface 35 of the body of semiconductor material 28 in an area 26, (FIG. 1) between the base metallization 10 and the emitter metallization 24. PN junction 33 is protected by a thin electrically insulating layer 37 which may be silicon oxide, for example. In FIG. 1 portions of the base metallization 10, the emitter metallization 24 and the electrically insulating layer 37 are cut away to more clearly illustrate the location of the PN junction.

The body of semiconductor material 28 includes an N+ conductivity type emitter region 30, a P conductivity type base region 32, a collector region comprising an N conductivity type region 34 and an N+ conductivity type region 36. A collector electrode 38, preferably made of molybdenum, is alloyed to the N+ region 36. The alloy region 40 is an alloy of silver, lead and antimony. Collector electrode 38 may also be alloyed to the collector region 36 using other conventional alloying processes.

Emitter and base metallizations 24 and 10, preferably deposited aluminum, are respectively affixed to the N+ conductivity type emitter region 30 and the P conductivity type base region 32 to provide electrical contact thereto. A molybdenum emitter electrode 44 is in pressure contact with the emitter metallization 24. In this structure, the effective emitter resistance of the transistor 8 is determined primarily by the interface or contact between the aluminum metallization 24 and the N+ emitter region 30.

The typical prior art transistor 8 has a diameter of approximately 658 mils. Emitter metallization 24 has a width of approximately 26 mils along section line II—II. Edge portions of emitter metallization 24 extend beyond the edge of emitter electrode 44 by approximately 1 mil.

Figure 3:
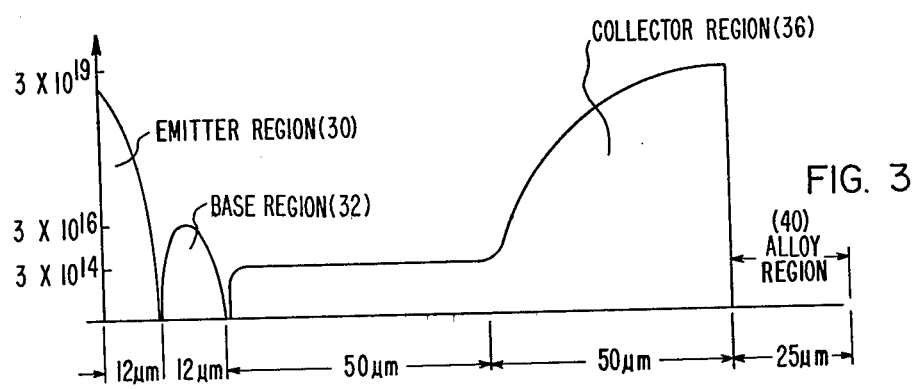
FIG. 3 is a diagram illustrating the impurity concentration and dimensions of the various regions of the transistor illustrated in FIG. 1.

FIG. 3 is a diagram illustrating the impurity concentration and thickness of the emitter region 30, the base region 31 and the collector region 36. The alloy region 40 is approximately 25 microns thick. The transistor 8 can be constructed and packaged using well known semiconductor processes and techniques. Therefore, no detailed process for constructing the transistor or package for providing environmental protection is shown.

It is well known that under some operating conditions, the prior art transistor illustrated in FIGS. 1 and 2 can develop "hot areas". The safe operating area of these transistors is selected to prevent the development of these "hot areas" which cause the emitter current to "collapse" resulting in a severe degradation of the electrical characteristics.

Figure 4:
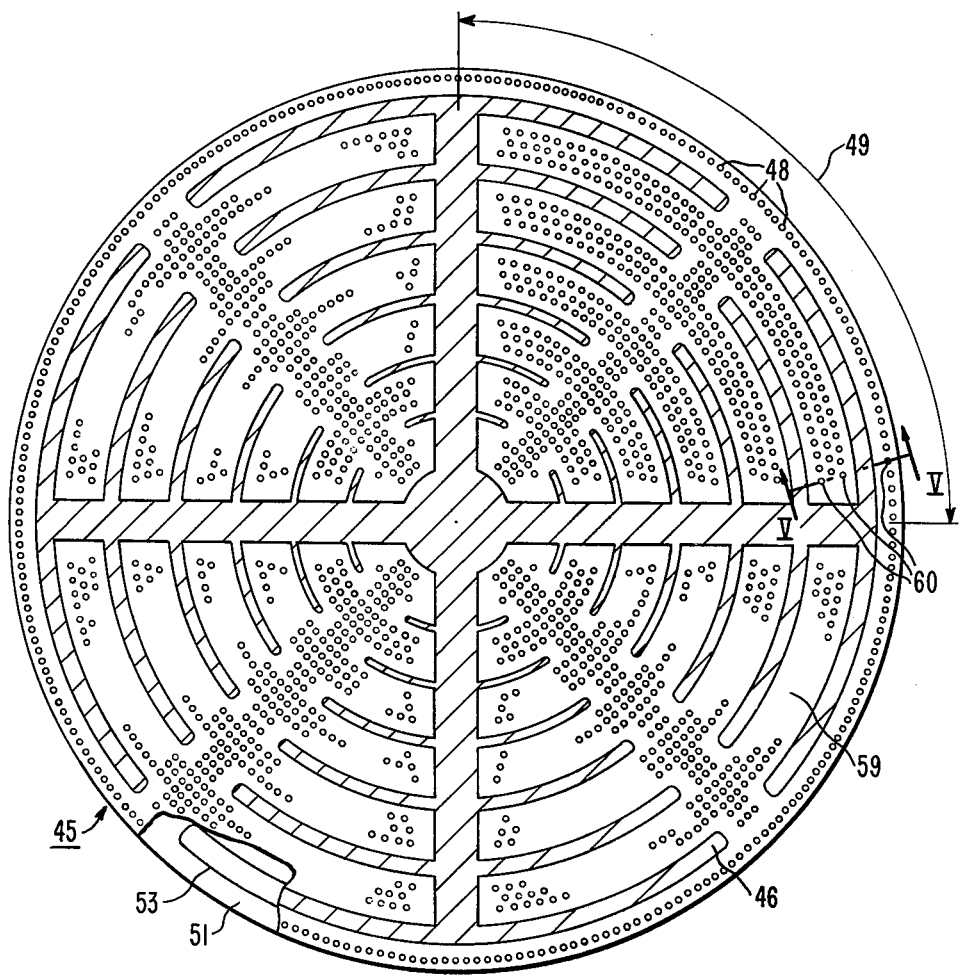
FIG. 4 is a top view of a transistor comprising the preferred embodiment of the invention.
Figure 5:
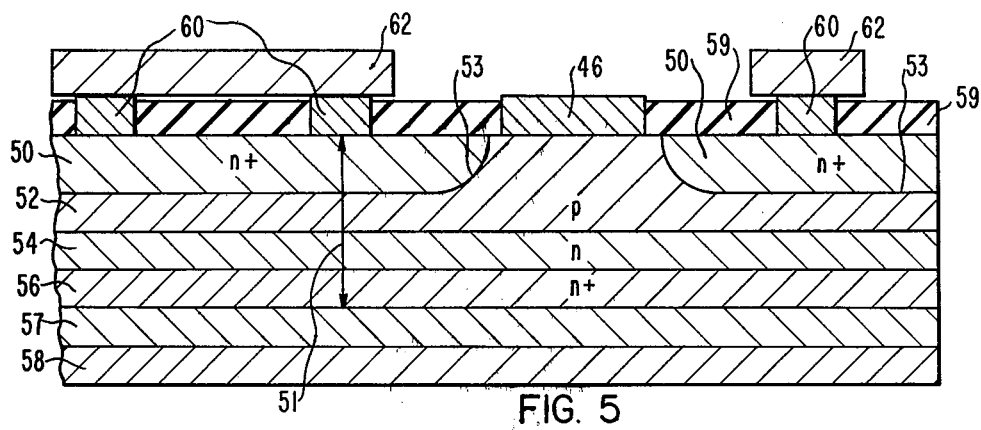
FIG. 5 is a partial cross-section of the transistor comprising the preferred embodiment of the invention.

FIG. 4 is the top view and FIG. 5 is a partial cross sectional view of a transistor 45 comprising the preferred embodiment of the invention. The transistor 45 is essentially identical to transistor 8 (FIG. 1) except that the emitter region 51 is partially metallized to achieve a preselected effective emitter resistance and prevent "hot areas" from developing.

The preferred embodiment of the invention, transistor 45, utilizes a body of semiconductor material 51 having two substantially flat opposed major surfaces and an edge portion extending therebetween. The body of semiconductor material 51 and the base metallization 46 are essentially identical to the body of semiconductor material 28 and the base metallization 10 of the prior art transistor 8 described above and illustrated in FIG. 1. Contact to the emitter region 50 of the transistor 45 is provided by a metallization, preferably deposited aluminum, consisting of a plurality of spaced apart areas which for convenience are referred to as "dots". Although the "dots" are illustrated as being circular, other geometric shapes, such as rectangles can be used. Three typical "dots" around the periphery of transistor 45 are illustrated in top view and identified by reference numeral 48 (FIG. 4). "Typical" is used to mean that the remainder of the "dots" which are distributed over the emitter region 50 are substantially identical to the "dots" identified by reference number 60. Also the complete distribution patterns for the "dots" is only shown for one quarter identified by arc 49 of the transistor 45. The remainder of the emitter region 50 is completely covered by an identical pattern of "dots" with only a portion of the "dots" being shown for convenience of illustration.

The body of semiconductor material 51 includes an N+ emitter region 50, a P conductivity type base region 52, and a collector region comprising N conductivity type region 54 an N+ region 56. A collector electrode 58, preferably made of molybdenum, is affixed to the N+ collector region 56 by an alloy region 57 comprising an alloy of silver, lead and antimony. Other conventional alloying processes may be used to affix the collector electrode 58 to the collector.

The non-metallized portions of the upper surface of the body of semiconductor material 51, including the PN junction 53 formed at the interface of emitter and base regions 50 and 52, is protected by a thin electrically insulating layer 59 of silicon oxide for example. A small portion of the insulating layer 59 is cut away in FIG. 4 to expose the body of semiconductor material 51 and the PN junction 53, for purposes of further illustrating the relationship of PN junction 53 to the base metallization 46.

A series of circular aluminum "dots" 60 spaced along arces of circles concentric with the center of the transistor 45 comprise the emitter metallization. Three typical dots taken along cross-section III—III are illustrated in FIG. 4 at reference numeral 60. A molybdenum emitter electrode 62 is in pressure contact with the aluminum "dots" 60 comprising the emitter metallization. Electrically insulating layer 59 prevents the emitter electrode 62 from electrically contacting the emitter region 50 except through the emitter metallization comprising the "dots" 60. The area of the individual "dots" and the number of these "dots" are selected to produce an effective emitter resistance which will result in the transistor 45 having the desired safe operating region. The emitter electrode may be held in pressure contact with the "dots" 60 comprising the emitter metallization using conventional techniques. Conventional packages may also be used to provide environmental protection for transistor 45.

The effective emitter resistance of the transistor 45 is determined by the area of the emitter metallization with respect to the total emitter area, and the contact resistance between the emitter metallization and the emitter region 50. By adjusting the size of the individual "dots" and the total area of the "dots" as compared to the total area of the emitter region 50, the desired effective emitter resistance can be achieved resulting in the transistor 45 having a predetermined safe operating area and "hot areas" can be eliminated.

Figure 6:
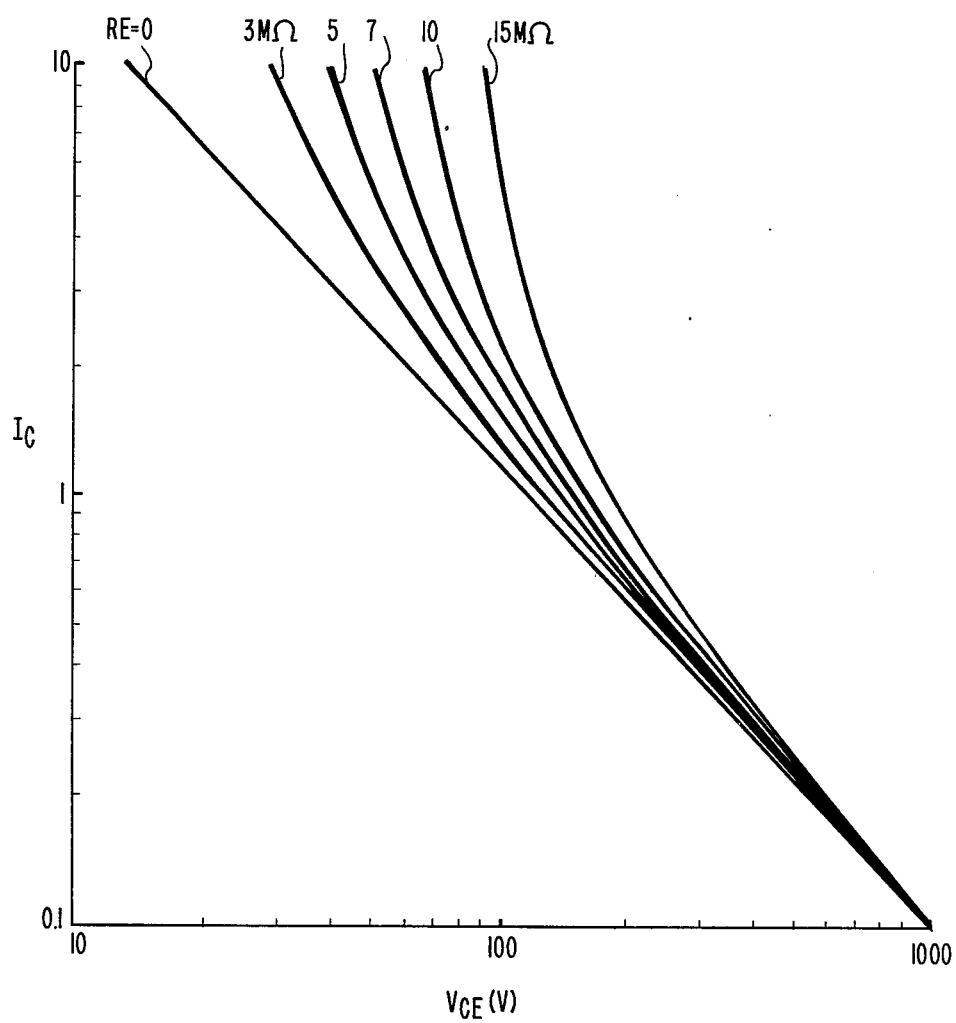
FIG. 6 is a graph illustrating the safe operating region for selected values of effective emitter resistance.

The total area of the emitter metallization and the diameter of the circular aluminum "dots" comprising the emitter metallization is determined using the following procedure. The first step is to determine the desired safe operating area for the transistor 47 for various values of effective emitter resistance ($R_e$). FIG. 6 is a graph illustrating the safe operating area of a transistor 45 as a function of ($R_e$). The specific transistor utilized in developing the curves illustrated in FIG. 6 had a thermal resistance of 0.15° C/W. The curves illustrated in FIG. 6 are calculated using the procedure described in an article entitled "Comparison of One-and-Two Dimensional Modes of Transistor Thermal Instability" by P. L. Hower & P. K. Govil, *IEEE Transactions On Electron Devices* V. Ed-21, Oct. 1974, pp 617–623. Other transistors will have similar curves.

For purposes of illustration, assume that it is desired to metallize the emitter such that the transistor may be safely operated at a $V_{CE}=100$ volts and $I_C=5$ amps. This operating point corresponds to a value of $R_e=15$ milliohms from FIG. 6.

Figure 7:
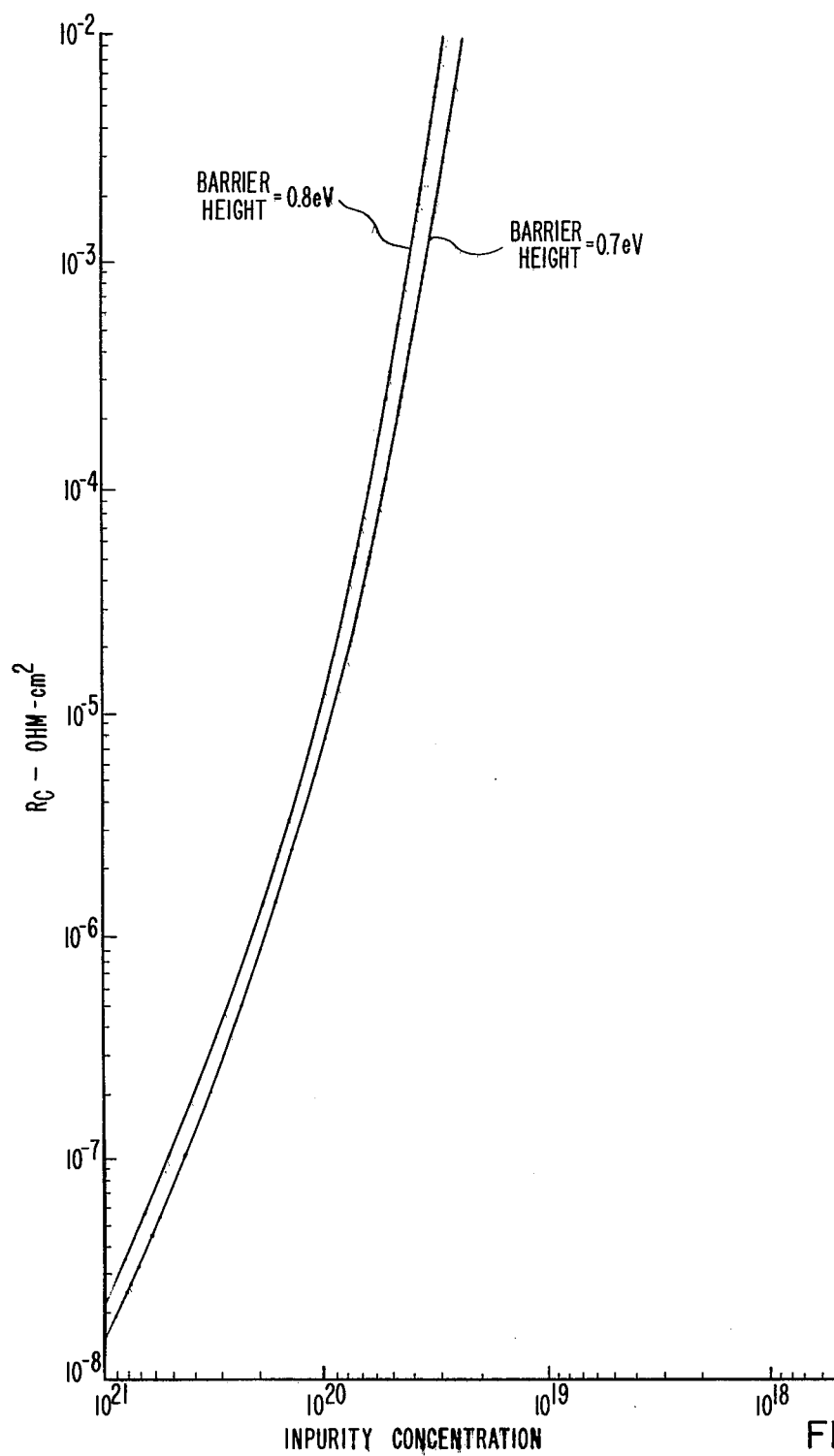
FIG. 7 is a graph illustrating the range of contact resistance between aluminum and N conductivity type silicon.

After the desired safe operating area has been selected, as discussed above, the area to be metallized is calculated using the following equation:

$$R_c = R_c/A_e$$

where
$R_c$ = the contact resistance between the emitter metallization and the emitter region in ohm-Cm$^2$
$A_e$ = area of the emitter region to be metallized.
The value of resistance between the emitter metallization is largely determined by the impurity concentration of the emitter region. FIG. 7 is a curve showing the calculated value of $R_c$ for N conductivity type emitter regions and for an aluminum metallization. Similar curves are available for P conductivity semiconductor materials and for other metals as a contact.

In the example, the emitter impurity concentration is approximately $3 \times 10^{19}$ cm$^3$ from FIG. 3. Since the emitter region is N conductivity type, this gives a value of $R_c = 5 \times 10^{-3}$ ohms-Cm$^3$. Using this value, $A_e$ is calculated using the formula:

$$A_e = (5 \times 10^{-2})/(8 \times 10^{-3}) = 0.625 \text{ Cm}^2.$$

In this example, the total area of the emitter region 50 (FIG. 5) is 1.6 cm$^2$, a partial metallization of the emitter region is thus required to achieve the desired value of $R_e$.

In selecting the partial metallization pattern, a pattern is selected which will result in the final transistor being the electrical equivalent of plurality of transistors connected in parallel with each transistor including an internal ballast resistor whose value is determined by the emitter metallization. The effect of these ballast resistors is to assure that the emitter current is distributed over the emitter region 50 such that "hot areas" do not develop.

Each "dot" comprising the emitter metallization is assumed to be the emitter metallization of one of the plurality of transistors described above. The area of each of these dots is selected to be less than the "hot area" which would be expected to occur under thermally unstable conditions assuming that the entire emitter region 50 is metallized. The size of these "hot areas" is a complicated function of geometry and operating conditions. However, experience has shown that for most transistors currently used these "hot areas" are in the range of $6 \times 10^{-3}$ to $1 \times 10^{-2}$ cm$^2$. This means that the "dot" diameter should be a small fraction of $8.74 \times 10^{-2}$ cm (34 mils). In the example, a diameter of 6 mils was selected. A thorough discussion of the size of "hot areas" produced by thermal instability can be found in an article titled "Stable Hot Spots and Second Breakdown in Power Transistors" by Philip L. Hower, David L. Blackburn, Frank F. Dittinger and Sherwin Rubin, p. 234, PESC 76 Record.

Using the above criteria, the center to center spacing of the "dots" comprising the emitter metallization is calculated using the formula $$L_{C-C} = A_{dot} (A_{e\ diffused} / A_{e\ contact})$$

For the above example, this results in a center to center spacing of 8.5 mils.

Using the above calculated "dot" diameter and center to center spacing, the "dots" comprising the emitter metallization are distributed over the emitter region in the pattern illustrated in FIG. 4. Other distribution patterns could also be used. The critical feature is to assure that the total area of the emitter metallization is selected such that the desired effective value of RE is achieved and that the metallization is distributed over the emitter area such that "hot areas" do not develop.

Figure 8:
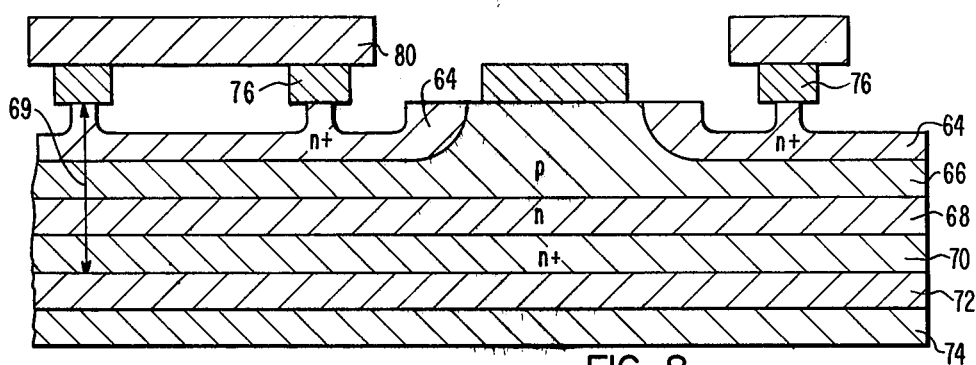
FIG. 8 is a partial cross-section of a second embodiment of the invention.

FIG. 8 is a cross-section of a second embodiment of the invention. This embodiment also uses a body of semiconductive material 69 having upper and lower surfaces, and an edge portion extending therebetween. The body of semiconductive material includes an N+ emitter region 64, a P conductivity type base region 66, an N region 68 and an N+ region 70 comprising the collector. A molybdenum collector electrode 74 is affixed to the N+ collector region 70 by an alloy region 72. Electrical contact is made to the emitter region 64 by a series of circular aluminum "dots" 76. The size and distribution of the "dots" 76 are determined as described above with reference to the preferred embodiment of the invention, transistor 45. Grooves or moats 78 are etched in the emitter region 64 between the dots of aluminum 76. A molybdenum emitter contact 80 is in pressure contact with the aluminum dot 76. As in the previous embodiment, the effective emitter resistance is determined by the area of the aluminum dot 76 with respect to the total emitter area.

Prior Art transistors of the type illustrated in FIG. 1 actually built having a diameter of 658 mills approximately had an effective emitter resistance of 3 milliohms. By contrast, the same transistor, except that the emitter metallization comprised "dots" had a diameter of approximately 4 mils resulted in an effective emitter resistance of approximately 15 milliohms. This transistor is the preferred embodiment illustrated in FIG. 4. Thus, it can be seen that the partial emitter metallization has resulted in an increase of the effective emitter resistance by a factor of five.

Figure 9:
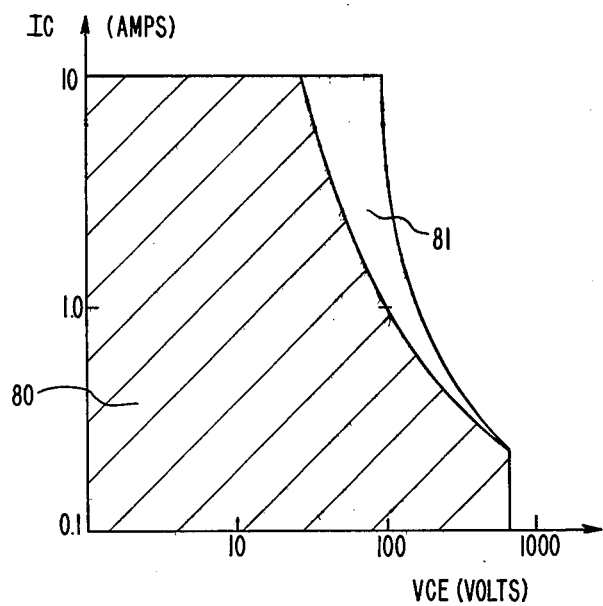
FIG. 9 is a graph illustrating the safe operating area of a typical prior art transistor and the transistor which comprises the preferred embodiment of the invention.

The safe operating area 80 of the prior art transistor illustrated in FIG. 1 is illustrated as a cross-hatched area in FIG. 9. Similarly, the safe operating area of the preferred embodiment of the invention, transistor 45, includes the cross-hatched area 80 plus an additional non-cross-hatched area 81. Since the basic difference between the prior art device to which the preferred embodiment is the partial emitter metallization, FIG. 9 clearly establishes the improved performance of the transistor 45 (FIG. 4) comprising the preferred embodiment of the invention.

From the above description of the preferred embodiment, it is clear that the partial metallization of the emitter area increases the safe operating area of the transistor by increasing the effective emitter resistance. Distributing the partial metallization in isolated "dots" also aids in distributing the emitter current more evenly over the entire emitter region thereby reducing or eliminating "hot areas" common in prior art transistors under thermally induced unstable operating conditions. Similar partial metallizations may be useful in assuring more even current distribution in other semiconductor devices, such as thyristors and diodes, for example. However, the criteria for determining the total area of the partial metallization and its distribution may be different.

What is claimed is:

1. A transistor comprising:
   (a) a body of semiconductor material having first and second substantially flat opposed surfaces and an edge extending therebetween, said body of semiconductive material including an emitter region, a base region and a collector region, portions of said emitter and base regions extending to said first surface and said collector region extending to said second surface;
   (b) a collector electrode affixed to said collector region;
   (c) a base electrode affixed to said base region;
   (d) an emitter electrode; and
   (e) an emitter metallization comprising a plurality of non-abutting metallized regions affixed to said emitter region, said emitter metallization forming an electrical connection between said emitter region and said emitter electrode with the number and area of said metallized regions being selected such that said transistor has a desired effective emitter resistance.

2. A transistor in accordance with claim 1 wherein said emitter metallization comprises a plurality of non-abutting circular areas with each of said areas being less than "hot areas" induced as a result of thermal instability in said transistor.

3. A transistor in accordance with claim 1 wherein said emitter metallization is aluminum.

4. A transistor in accordance with claim 1 wherein said emitter region is N conductivity type.

5. A transistor in accordance with claim 4 wherein said base region is P conductivity type.

6. A transistor in accordance with claim 5 wherein said collector region is N conductivity type.

7. A transistor comprising:
   (a) a body of semiconductor material having substantially flat opposed major surfaces, said semiconductor body including at least first, second and third regions, first and second PN junctions respectively formed at the interface of said first and second regions and at the interface of said second and third regions;

(b) a first electrode affixed to said first region;

(c) an electrode metallization comprising a plurality of non-abutting electrically conductive members affixed to said first region of said body of semiconductor material, said electrode metallization forming an electrical connection between said first electrode and said first region of said body of semiconductor material with the total area of said electrode metallization selected to give a preselected effective resistance between said first electrode and said first region;

(d) a second electrode affixed to said region of said body of semiconductor material; and (e) a third electrode affixed to said third region.

8. A transistor in accordance with claim 7 wherein the combined area of said electrically conductive member comprising said electrode metallization is calculated from the formula $$A_e = R_c/R_e$$

where
$A_e$ = total area of metallization
$R_c$ = the contact resistance between the members of said metallization and said second region of said body of semiconductor material
$R_e$ = the desired effective emitter resistance of said transistor.

9. A transistor in accordance with claim 8 wherein each of said electrically conductive members comprising said electrode metallization is circular and has an area in the range of $6.0 \times 10^{-3}$ to $1.0 \times 10^{-2}$ Cm$^2$.

10. A transistor in accordance with claim 9 wherein said electrically conductive members comprising said electrode metallization are aluminum.

11. A transistor in accordance with claim 10 wherein said body of semiconductor material is silicon.

12. A transistor in accordance with claim 11 wherein said first region of said body of semiconductor material comprises an emitter region.

13. A transistor in accordance with claim 12 wherein said emitter region is N conductivity type.

14. A transistor in accordance with claim 13 wherein said second region of said body of semiconductor material comprises a P conductivity type base region.

15. A transistor in accordance with claim 14 wherein said third region of said body of semiconductor material comprises an N conductivity type collector region.

16. A method for metallizing the emitter region of a transistor to increase the safe operating region comprising the steps of:

(a) calculating the safe operating region of the transistor assuming different values of effective emitter resistance;

(b) selecting an effective emitter resistance to give the desired safe operating area based on calculations performed in accordance with step (a);

(c) determining the effective contact resistance between the emitter region and the emitter metallization based on the conductivity type of the emitter region, the impurity concentration of the emitter region and the metal used for the emitter metallization;

(d) determining the total area of the emitter metallization necessary to result in the desired effective emitter resistance;

(e) affixing an emitter metallization to said emitter region, said emitter metallization comprising a plurality of non-abutting regions with each region having an area less than the expected "hot area" under thermally induced unstable operating conditions.

* * * * *